(12) United States Patent
Feiweier et al.

(10) Patent No.: US 7,002,347 B2
(45) Date of Patent: Feb. 21, 2006

(54) LOCAL COIL UNIT FOR A MAGNETIC RESONANCE APPARATUS

(75) Inventors: Thorsten Feiweier, Poxdorf (DE); Razvan Lazar, Erlangen (DE); Wolfgang Renz, Erlangen (DE); Lothar Schön, Neunkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/953,303

(22) Filed: Sep. 29, 2004

(65) Prior Publication Data
US 2005/0110493 A1 May 26, 2005

(30) Foreign Application Priority Data
Sep. 29, 2003 (DE) ................. 103 45 176

(51) Int. Cl.
*G01V 3/00* (2006.01)
(52) U.S. Cl. .................... 324/318; 600/421
(58) Field of Classification Search ............. 324/318, 324/322, 300, 319, 309; 600/410, 421
See application file for complete search history.

(56) References Cited

U.S. PATENT DOCUMENTS

| | | | |
|---|---|---|---|
| 5,017,872 A | * | 5/1991 | Foo et al. ............. 324/322 |
| 5,410,251 A | | 4/1995 | Renz |
| 5,865,177 A | * | 2/1999 | Segawa ............. 600/410 |
| 5,913,888 A | | 6/1999 | Steinmeyer et al. |
| 6,252,403 B1 | | 6/2001 | Alsop |

OTHER PUBLICATIONS

Disclosure RD442005 - Publication Date Feb. 10, 2001.
"Manipulation of Signal Intensity Distribution with Dielectric Loading at 7.0T," Yang et al, Proc. Intl. Soc. Mag. Reson. Med., vol. 9 (2001) p. 1096.

* cited by examiner

*Primary Examiner*—Louis M. Arana
(74) *Attorney, Agent, or Firm*—Schiff Hardin LLP

(57) ABSTRACT

A local coil unit for a magnetic resonance apparatus, which radiates a radio-frequency field into an examination subject, has a housing and at least a part of the housing is formed of an insulating dielectric material that passively compensates for an inhomogeneity in the high-frequency field in the subject. The material has a relative dielectric value $\epsilon_r$ of greater than 50, preferably greater than 100, and a dielectric loss factor $\tan \delta$ of less than $2.5 \times 10^{-2}$, preferably less than $1 \times 10^{-3}$. In the dielectric material displacement currents are generated which create an additional magnetic field that compensates for the minima in the B1 field as a result of the eddy currents arising in the patient due to the radio-frequency radiation.

14 Claims, 2 Drawing Sheets

LOCAL COIL UNIT FOR A MAGNETIC RESONANCE APPARATUS

BACKGROUND OF THE INVENTION

1. Field of the Invention

The present invention relates to a local coil unit for a magnet resonance apparatus that radiates a radio-frequency field into an examination subject.

2. Description of the Prior Art

Magnetic resonance tomography has become a widely used technique for obtaining images of the inside of a body of a living subject under examination. To obtain an image using this technique the body or the part of the body to be investigated must initially be subjected to a static base magnetic field that is as homogeneous as possible (generally referred to as a B0 field) which is generated by a basic field magnet of the magnetic resonance device (MR device). During the data acquisition recording this basic magnetic field is overlaid with rapidly switched gradient fields for spatial coding, which are generated by gradient coils.

Radio-frequency antennas are used to radiate radio-frequency pulses of a defined field strength into the subject under examination. The magnetic flux density of these radio-frequency pulses is normally designated B1, the pulsed radio-frequency field is also generally abbreviated as the B1 field. Magnetic resonance signals are triggered by the radio-frequency pulse in the subject under examination and these signals are received by radio-frequency receive antennas. These antennas can either be the same antennas with which the radio-frequency pulses were emitted or they can be separate reception antennas.

The magnetic resonance images of the examination subject are created on the basis of the magnetic resonance signals received. Each pixel in the magnetic resonance image is assigned in this case to a small volume of the body, known as a "voxel". Each brightness or intensity value of the pixels is linked to the signal amplitude of the magnetic resonance signal received from this voxel. The strength of the magnetic resonance signal in this case depends on factors such as the strength of the radiated B1 field. Variations in space and time in the field strength of the exciting B1 field lead to undesired changes in the received magnetic resonance signal that can falsify the measurement result. Thus the spatial distribution of the amplitude of the B1 field typically causes an undesired dependence of the image contrast on the spatial position. This results from an overlaying of the intensity distribution caused by the field distribution, with the intensity distribution, which for example is determined by the tissue material at the relevant location and which contains the image information that is actually required.

Such undesired amplitude distributions of the radio-frequency field are increasingly to be found because of the penetration behavior of the radio-frequency fields in dielectric and conductive media in the area of higher magnetic field strengths, i.e. greater than 1.5 Tesla, as well as with the use of local transmission coils or transmission arrays. Although magnetic resonance devices with basic magnetic fields greater than 1.5 T basically make images with better resolutions possible, conventional types of these magnetic resonance devices have the disadvantage of increasing the inhomogeneous B1 field distributions, which stem for example from radio-frequency eddy currents in the subject under examination.

In the prior art example U.S. Pat. No. 6,252,403 it is proposed to compensate for these types of eddy current by constructing the transmission antennas in a spiral form. The transmission antenna thus assumes the form a birdcage resonator wound around its axis of symmetry. This patent further discusses the influence of dielectric material on a signal drop at the edge of a head under examination. A cushion filled with water counters the signal drop, since it counteracts the abrupt change in the dielectric characteristics of the head and leads to a homogenization of the magnetic resonance image. Accordingly, a spiral coil is proposed having a flexible container filled with a dielectric liquid, which can shape itself to the upper part of the head.

Despite these efforts in the prior art, the inhomogeneities in the excitation field cannot be sufficiently compensated in all cases.

A reduction in the effects of inhomogeneous B1 field distributions can be achieved by a homogenization of the radiated radio-frequency field in the examination subject. To this end it is proposed by Yang et al. in Proc. Intl. Suc. Mag. Reson. Med 9, 2001, Page 1096 under the title "Manipulation of Signal Intensity Distribution with Dielectric Loading at 7.0T" to homogenize the radio-frequency field in the body by using dielectric cushions. However to date there has been no configuration which functions universally for each body and each position. A practicable realization of such concepts thus is not foreseeable at the present time.

Under the Derwent Accession Number RD 2001-449456, Research Disclosure RD442005-A dated Oct. 2, 2001 describes suppression of RF resonances by packing the body of a patient into flexible dielectric material. The material has dielectric constant corresponding to the tissue of the patient but exhibits low dielectric losses. The head (body), which is thus enlarged with structures that are typically filed with liquid, allows a special design of an RF coil that minimizes the dielectric resonances and the RF homogeneity is increased.

To receive magnetic resonance signals radio-frequency reception antennas are used. These are either permanently mounted in the magnetic resonance device or they can be positioned as local coil units selectively close to the area under examination.

Factors that influence the choice of the materials for the local coil housing are those of a practical, economic aesthetic and not least environmentally-relevant nature (recycling, disposal). The housing material should be MR-inert and non-conductive, i.e. it should exhibit the lowest possible magnetic susceptibility, a high electric insulation, high dielectric strength and low dielectric losses. Because of the direct contact with the patient, further material requirements in relation to fire protection, bio-compatibility and hazardous material content must be fulfilled. In addition the material must be easy to clean and to disinfect. Accordingly housings of these types of local coils generally consist of plastic (typically of Polystyrol or Nyrol) and/or of foam plastic.

A radio-frequency system of a magnetic resonance tomography device is known from DE 4314338 C2 that has screening means for E-field limitation. The task of the screening means is to suppress the E-field coupling of an antenna arrangement with the biological tissue more strongly, without having an associated significant adverse effect on the B-field. A plate or layer-type screening element made from insulated, dialectic material with a relative dielectric constant $\epsilon_r$ of at least 50 and with a loss factor tan $\delta$ of at most $2.5 \, 10^{-2}$ acts as a screening or shielding layer, which is permanently disposed locally in the area of an increased field strength of the E-field at the antenna arrangement, and which is displaced in relation to the antenna arrangement and in relation to a surface of a body to be examined. Capacitors in local coils, whole-body resonators and their leads are considered as areas of increased field strength.

From German DE 196 48 253 A1 an antenna arrangement is known that has a cooled antenna within a cryostatic housing. The cryostatic housing is provided with a an RF-transparent window on a side facing a cold part, which is formed of a material with a small dielectric loss factor. Typical examples of such materials are sapphire Polystyrol or Polysulphon. These materials allow a vacuum-sealed construction of the housing and barely attenuate an RF field for the highly sensitive antenna device. Such materials have low dielectric values.

SUMMARY OF THE INVENTION

An object of the present invention is to provide a local coil that causes a passive compensation of B1 inhomogeneities in an examination subject.

This object is achieved in accordance with the invention by a local coil unit for a magnetic resonance device which radiates a radio-frequency field into an examination subject, having a housing with at least one part of the housing formed of an insulating dielectric material with the highest possible relative dielectric value $\epsilon_r$ greater than 50, which is embodied for passive compensation of an inhomogeneity in the radio-frequency field in the examination subject and encompassing a surface area of 100 cm² to 300 cm² in accordance with the extent of the eddy current causing the inhomogeneity, and is disposed in the operating state of the local coil unit so that it is resting on the body.

One advantage of a local coil unit of this type is the fact that, in the dielectric material, displacement currents are generated by the radio-frequency field, which in turn create a magnetic field. This magnetic field counters a B1 field suppression that is generated by the characteristics of the examination subject. Specifically it compensates for B1 field suppressions that are based on an inductive eddy current. These types of inductive eddy currents arise, for example, in the heart region of the patient or in the area of the spinal column musculature. In other words, the use of the dielectric material in the housing of the local coil unit leads to a reduction in B1-field inhomogeneities. A requirement is that the dimensions and the dielectric characteristics of the material are adapted to the dimension of the inductive eddy currents and thereby to the inhomogeneity. The nearer the dialectic material is bought to a B1 field-suppressed zone, the more precisely and simply the B1 field minimum can be compensated for by the displacement current magnetic fields.

A further advantage of the invention is that, because the local coil unit is used in the vicinity of the body, the dielectric material is automatically positioned correctly. For example, the examination of the upper body is undertaken with a body coil unit lying on the body that receives magnetic resonance signals from the area to be examined. B1 field minima in the heart area are compensated in the optimum way by the dielectric material in the coil housing which lies on the patient's chest. The spinal column unit is particularly suitable for compensating for B1 field minima in the area of the spinal column musculature. This is because, for MR examinations the patient generally is lying on his or her back on a patient table into which the spinal column unit is integrated. Preferably the dielectric material is built into the cover of the spinal column unit in this case.

In an embodiment of the local coil unit in accordance with the invention the material has a dielectric value $\epsilon_r$ greater than 50, preferably greater than 100 and a dielectric loss factor tan δ of less than $2.5\times10^{-2}$, preferably less than $1\times10^{-3}$.

An advantage of placing the material close to the inhomogeneity is that little dialectic material is needed to generate a sufficient displacement current with the corresponding magnetic field.

In a further embodiment of the local coil unit the material is embodied as a surface that is as enclosed as possible, which is preferably 100–300 cm² in size. The dimensions of this surface roughly correspond to the dimensions of the eddy currents that lead to B1 field suppression.

In a further embodiment of the local coil unit the enclosed surface has a cutout. This has the advantage of allowing a normal coil housing to be used for the local coil unit, most of these housings have cutouts to save weight, for easier handling and to facilitate laying them on a patient.

Further advantages of the invention are the at least partial reduction of electrical coupling of local coil unit with a whole body coil unit, and an extensive screening of the local coil unit from electrical field components. The latter has direct additional advantages such as a reduction of noise during reception, and an improved electrical decoupling of a receiver coil unit from the surrounding body transmission coils. In the reception mode this leads to an increase of the signal level and in the transmission mode this leads to a decoupling between the transmission and reception antenna.

It is especially advantageous for homogenizing the B1 field, for suppressing noise as well as for increasing signal on receiving, for the material properties and material parameters of the "dielectrically active housing" to be optimized specifically for a local coil unit, which in turn is optimized for the examination of a specific region of the body. This can easily be done, for example, by design of the thickness of the material. Also advantageous is the use of particle-form materials with high dielectric values and low dielectric losses such as filler in a plastic or foam. In these cases the dielectric characteristics can be adjusted individually by the filler concentration and proportion of gas volume in the foam. For local coil units that are designed with a sensitivity volume specifically for defined regions of the body, such as the spinal column or body coil unit mentioned previously, the adaptation of the dielectric can be of particular advantage and can be targeted explicitly to a known B1 minimum.

DESCRIPTION OF THE PREFERRED EMBODIMENTS

Figure 1:
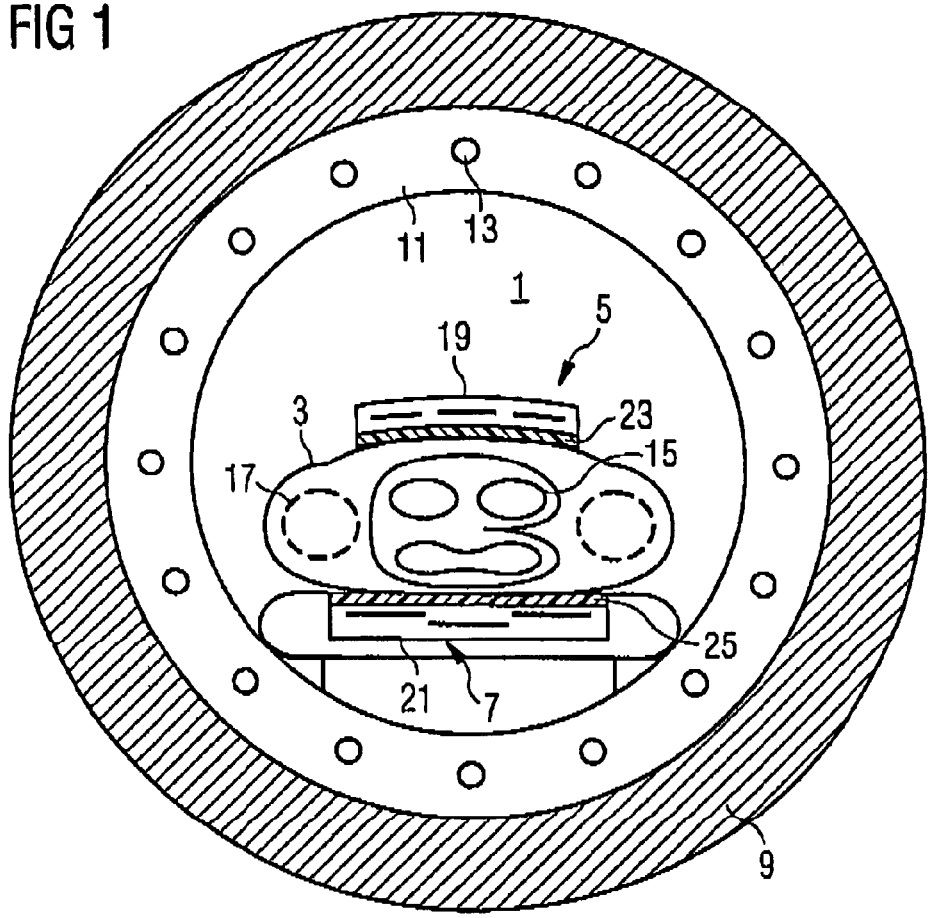
FIG. 1 is a cross-section through an examination area of a magnetic resonance device in which a patient is investigated with a body and a spinal column unit in accordance with the invention.

FIG. 1 shows a cross-section through an examination area 1 of a magnetic resonance device in which a patient 3 is being examined with a body and a spinal column unit 5,7.

With the aid of the base field magnet 9 the base magnetic field in the examination area 1 is generated. This is overlaid with the aid of a radio-frequency field generated by a whole-body antenna 11 within the body of the patient 3 it is desired to create as homogeneous a B1 field as possible. Residual inhomogeneities of the B1 field are sketched schematically in the body of patient 3. The solid lines 15 correspond to areas with reduced B1 field strength, the dashed lines 17 schematically sketch areas with increased B1 field strength. The inhomogeneities are essentially generated by inductively-created eddy currents in the patient 3. These flow in the heart area and in the area of the back musculature.

Magnetic resonance signals of the torso the of the patient 3 are received with local coil units, for example the body coil unit 5 and the spinal column unit 7. These contain a number of coils that are arranged in respective housings 19,21. A part of each housing 19,21 is formed of insulating dielectric material 23,25 which are preferably arranged in the areas of the coil unit 5,7 that are in contact with the patient 3. The dielectric part of the housing 19,21 preferably is an enclosed surface and preferably has a thickness of a few millimeters to a few centimeters. The insulating material preferably has a specific resistance of over $10^6$ $\Omega$m and a relative dielectric constant (Dielectric number or dielectric constant value) $\epsilon_r$ of at least 50, preferably of over 100. Further the material also preferably has a small dielectric loss factor tan $\delta$ of at most $2.5 \times 10^{-2}$, preferably at most $1 \times 10^{-3}$.

Materials which fulfill the specified conditions for the relative dielectric constant $\epsilon_r$ und the dielectric loss factor tan $\delta$ are in particular ceramic dielectrics, as used in RF capacitors for example. Appropriate dielectrics are listed in the German standard for ceramics and glass insulation materials "DIN VDE 0335", Part 1 and Part 3. February 1988, or in the corresponding International Standard "IEC 672-1 und 672-3" under the group designation "C-300". A number of suitable ceramic masses made of Titanates with Perovskite-type crystal structure and also be found in the book "HÜTTE des Ingenieurstaschenbuchs", 28th Edition, Bd. Hütte IV A: Elektrotechnik, Part A, 1957, Pages 802, 803. Especially suitable materials are oxide ceramic materials, for example pyro- or piezo-oxides, such as $TiO_2$, $BaTiO_3$, $(BaSr)TiO_3$, $PbTiO_3PbZrO_3$ or $Pb(Zr,Ti(O_3))$.

The suitable ceramic materials are used, for example, as disks with thicknesses in millimeters and diameters of a few centimeters, e.g. for manufacturing disk capacitors. The ceramic surfaces needed for application in the local coil unit can then be cut to match the form of the local coil unit. Barium titanate and the piezo-ceramic FPM 231, (made by Marco, Hermsdorf) have shown a suitable effect in the first studies.

Should these materials be especially problematic to work, since for example they are brittle, fragile or a danger to health, they could be kept away from the surface in contact with the patient by using an appropriate sandwich technique or their stiffness or other mechanical aspects could be reinforced. It is also advantageous to use particle-form materials with a high dielectric value and low dielectric losses as fillers in plastic or foam plastic recipes. In these case the dielectric characteristics can be adjusted individually using the filler concentrations and gas volume proportion in the foam.

Advantageous dimensions of the material for integration into the local coil housing are a thickness of around 5 mm and diameter in the order of magnitude of 10 centimeters or greater or surfaces of about DIN A4 size. These sizes roughly correspond to the extent of the minima in the B1 field.

In an embodiment of the spinal column unit 7 the material is arranged in the form of a plate in the cover of flat box-shaped housing of spinal column unit 7.

Figure 2:
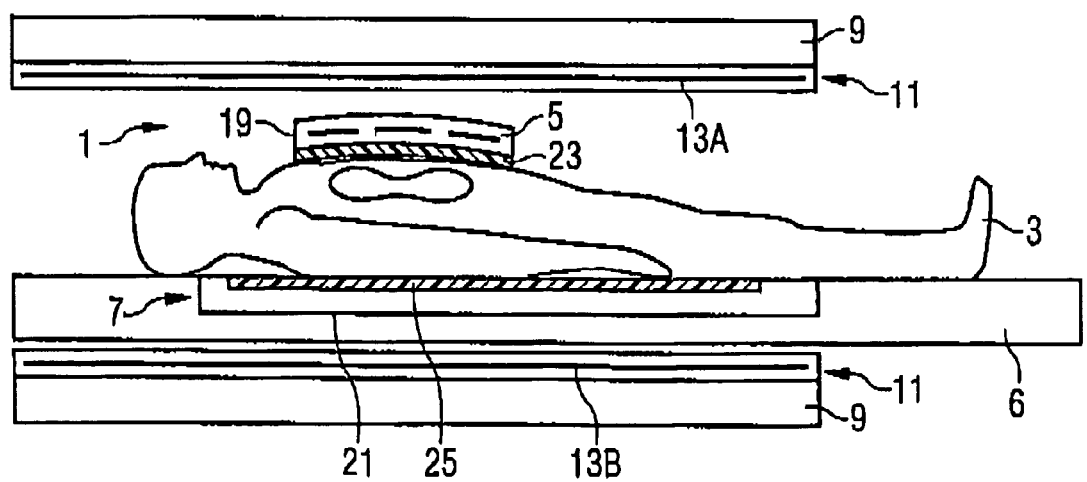
FIG. 2 is a lengthwise section through the examination area of FIG. 1.

FIG. 2 shows a lengthwise section through the area under examination 1, in which the patient 3 has been introduced onto the patient table 6 to allow their torso to be examined. The body coil 5 covers the chest of the patient 3 who in the area of their spinal column is lying on his or her back on the spinal column unit 7. The material 23, 25 is disposed close to the B1 field minima in the patient in the form of a plate in the coil unit and is in contact with the patient over as large an area as possible.

Figure 3:
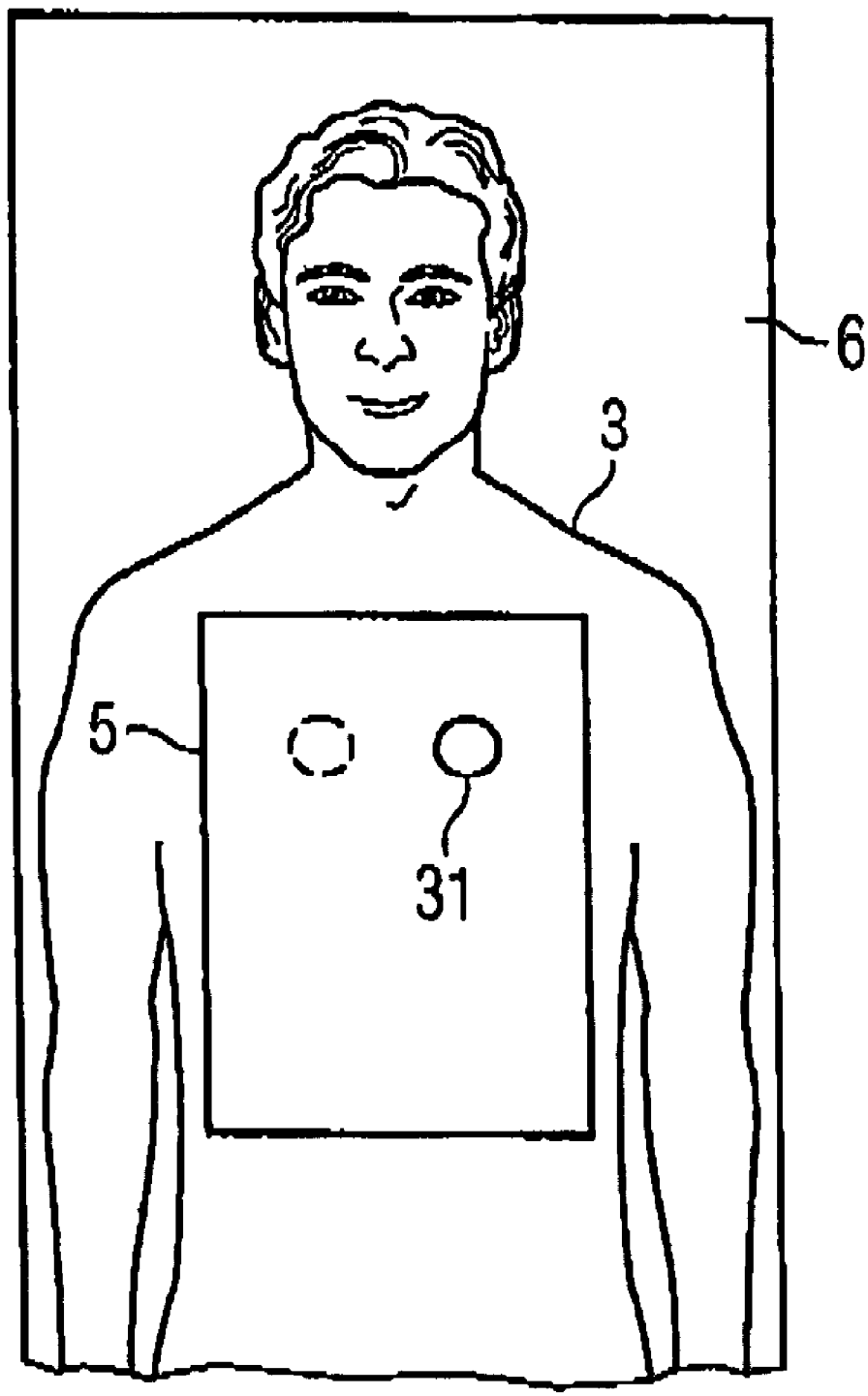
FIG. 3 is a view of the patient in the magnetic resonance device.

FIG. 3 shows a view of the patient 3 who is lying on the patient table 6 in the magnetic resonance device. The spinal column unit 5 lies on the torso of patient 3. Its contact side forms as enclosed a surface as possible in order not to interrupt the displacement current. Smaller cutouts in the housing, i.e. in the flat dielectric material as well for example, because of openings 31 in the body coil unit 5, have no significant effect on operation. They can for example be compensated, for example, by a greater wall strength of the material.

Although modifications and changes may be suggested by those skilled in the art, it is the intention of the inventors to embody within the patent warranted hereon all changes and modifications as reasonably and properly come within the scope of their contribution to the art.

We claim:

1. A local coil unit for a magnetic resonance apparatus comprising:
   a resonator for generating a radio frequency electromagnetic field, said resonator being adapted to radiate said radio frequency electromagnetic field into an examination subject that causes an inhomogeneity in said radio frequency electromagnetic field in the examination subject by eddy current generation; and
   a housing in which said resonator is disposed, at least a part of said housing being comprised of an insulating, dielectric material having a high relative dielectric value $\epsilon_r$ greater than 50, for compensating said inhomogeneity, said part of said housing encompassing a surface area in a range between 100 cm$^2$ to 300 cm$^2$ corresponding to an extent of said eddy current, said part of said housing being disposed in a region of said housing adapted for contact with said examination subject.

2. A local coil unit as claimed in claim 1 wherein said part of said housing is disposed in said region of said housing for placing said insulating, dielectric material as closely as possible to said inhomogeneity.

3. A local coil unit as claimed in claim 1 wherein said insulating, dielectric material has a relative dielectric value $\epsilon_r$ greater than 100.

4. A local coil unit as claimed in claim 1 wherein said insulating, dielectric material has a dielectric loss factor tan $\delta$ of less than $2.5 \times 10^{-2}$.

5. A local coil unit as claimed in claim 4 wherein said insulating, dielectric material has a dielectric loss factor tan $\delta$ of less than $1 \times 10^{-3}$.

6. A local coil unit as claimed in claim 1 wherein said insulating, dielectric material has a thickness of at least 5 mm.

7. A local coil unit as claimed in claim 1 wherein said inhomogeneity has dimensions, and wherein said surface area is adapted to said dimensions.

8. A local coil unit as claimed in claim 7 wherein said surface area has a cutout.

9. A local coil unit as claimed in claim 1 wherein said insulating, dielectric material contains a piezoceramic.

10. A local coil unit as claimed in claim 9 wherein said piezoceramic is at least partially comprised of FPM 231.

11. A local coil unit as claimed in claim 1 wherein said dielectric, insulating material is at least partially comprised of barium titanate.

12. A local coil unit as claimed in claim 1 wherein said housing is adapted in size and dimensions for use as a body coil unit.

13. A local coil unit as claimed in claim 1 wherein said housing is adapted in size and dimensions for use as a spinal column unit.

14. A local coil unit as claimed in claim 13 wherein said housing has a cover, and wherein said cover includes said part of said housing comprised of insulating, dielectric material.

* * * * *